United States Patent [19]

Reiber

[11] Patent Number: 4,868,572
[45] Date of Patent: Sep. 19, 1989

[54] CIRCUIT ARRANGEMENT FOR CONVERTING DIGITAL SOUND-SIGNAL VALUES INTO AN ANALOG SOUND SIGNAL

[75] Inventor: Hans Reiber, Stuttgart, Fed. Rep. of Germany

[73] Assignee: Alcatel N.V., Amsterdam, Netherlands

[21] Appl. No.: 162,221

[22] Filed: Feb. 29, 1988

[30] Foreign Application Priority Data

Feb. 28, 1987 [DE] Fed. Rep. of Germany ....... 3406508
Mar. 20, 1987 [DE] Fed. Rep. of Germany ....... 3709207

[51] Int. Cl.$^4$ ............................................. H03M 1/68
[52] U.S. Cl. ................................... 341/145; 341/146
[58] Field of Search ................ 341/144, 145, 146, 154

[56] References Cited

U.S. PATENT DOCUMENTS

| | | | |
|---|---|---|---|
| 4,137,525 | 1/1979 | Tyrrel | 341/145 |
| 4,539,553 | 9/1985 | Takeda et al. | 341/154 |
| 4,590,457 | 5/1986 | Amir | 341/145 |
| 4,704,600 | 11/1987 | Uchimura et al. | 341/144 |

FOREIGN PATENT DOCUMENTS 3617433 5/1986 Fed. Rep. of Germany .
1444216 2/1975 United Kingdom .

OTHER PUBLICATIONS

G. R. Ritchie, James C. Candy, and William H. Ninke, "Interpolative Digital-to-Analog Converters", in IEEE Transactions on Communications, volume COM-22, No. 11, Nov. 1974, pp. 1797–1806.
Robert W. Adams, "Design and Implementation of an Audio 18-Bit Analog-to-Digital Converter Using Oversampling Techniques", in J. Audio Eng. Soc., vol. 34, No. 3, Mar. 1986, pp. 153–166.

Primary Examiner—William M. Shoop, Jr.
Assistant Examiner—Marc S. Hoff
Attorney, Agent, or Firm—Spencer & Frank

[57] ABSTRACT

This circuit arrangement includes an interpolation filter (3) which converts the incoming signal values (A) into interpolated signal values (B) of increased repetition frequency. The interpolated signal values (B) are reduced in word length by means of a quantizer (4a) and by quantization error feedback through an error filter (25). A D/A converter (6) consists of two or more nonweighted switching stages connected in parallel. The activated switching stages deliver currents which are added together at the output end. The D/A converter (6) is controlled by a control circuit (5) which processes the output signals (D) of the quantizer (4a). The activated switching stages are continuously interchanged on a cyclic basis, so that relative resistance tolerances in the circuit average out.

12 Claims, 10 Drawing Sheets

CIRCUIT ARRANGEMENT FOR CONVERTING DIGITAL SOUND-SIGNAL VALUES INTO AN ANALOG SOUND SIGNAL

The present invention relates to a circuit arrangement for converting digital sound-signal values into an analog sound signal which has the following features:

a. an interpolation filter in which the incoming signal values are converted into a sequence of interpolated signal values of increased repetition rate, b. a reduction circuit which reduces the word length of the interpolated signal values and consists of a quantizer, an error filter, and an adding stage, c. a digital-to-analog converter (6)

c.c consisting of several nonweighted switching stages whose output currents are added at the output end of the digital-to-analog converter, d. a control circuit which, in response to the digital signal values at the output of the quantizer, controls the switching stages in such a way that the sum of the output currents is equal to the applied signal value, and that the activated switching stages are selected by cyclic step-by-step switching, and e. a low-pass filter following the digital-to-analog converter and delivering the analog signal.

Features a, b, c, and e are known from the prior application P 36 17 435.5 (internal case designation: H. Reiber 15X). Features c. c and d constitute the characterizing part of the main claim.

With the circuit arrangement disclosed in the prior application, the requirements on the accuracy of the digital-to-analog converter are greatly reduced in comparison with noninterpolative converter systems, but they are still difficult to meet if the circuit is to be implemented with CMOS technology.

In "IEEE Journal of Solid-State Circuits", Vol. Sc-21, No. 6, Dec. 1986, a CMOS digital-to-analog converter is described on pages 983 to 988 which is provided with 65 switching stages each consisting of a current source and a switch. 63 of these switching stages are arranged in a matrix and not weighted, while the two least significant switching stages are weighted in accordance with their binary weights. To reduce the effect of relative deviations of the individual switching stages on the signal-to-noise ratio of the circuit, the switching stages are activated in a symmetrical sequence.

A printed publication of Intermetall entitled "DIGIT 2000, VLSI Digital TV System", p. 106, describes an interpolative digital-to-analog converter which converts two digitized signal-value sequences of a stereo sound signal into pulse-width-modulated sound signals for the right and left stereophonic channels. With this converter, a signal-to-noise ratio of about 75 dB is achieved.

The object of the present invention is to provide a circuit arrangement for converting sound signals from digital to analog form which has a high signal-to-noise ratio.

According to the invention, this object is attained by the circuit arrangement claimed in claim 1.

The chief advantages of the circuit arrangement according to the invention are that it is well suited for CMOS integration, and that it can be used for high-quality terminal equipment with digital sound-signal-processing circuitry.

Further advantageous features of the invention are characterized in the dependent claims.

Embodiments of the invention will now be explained with reference to the accompanying drawings, in which.

Figure 5:
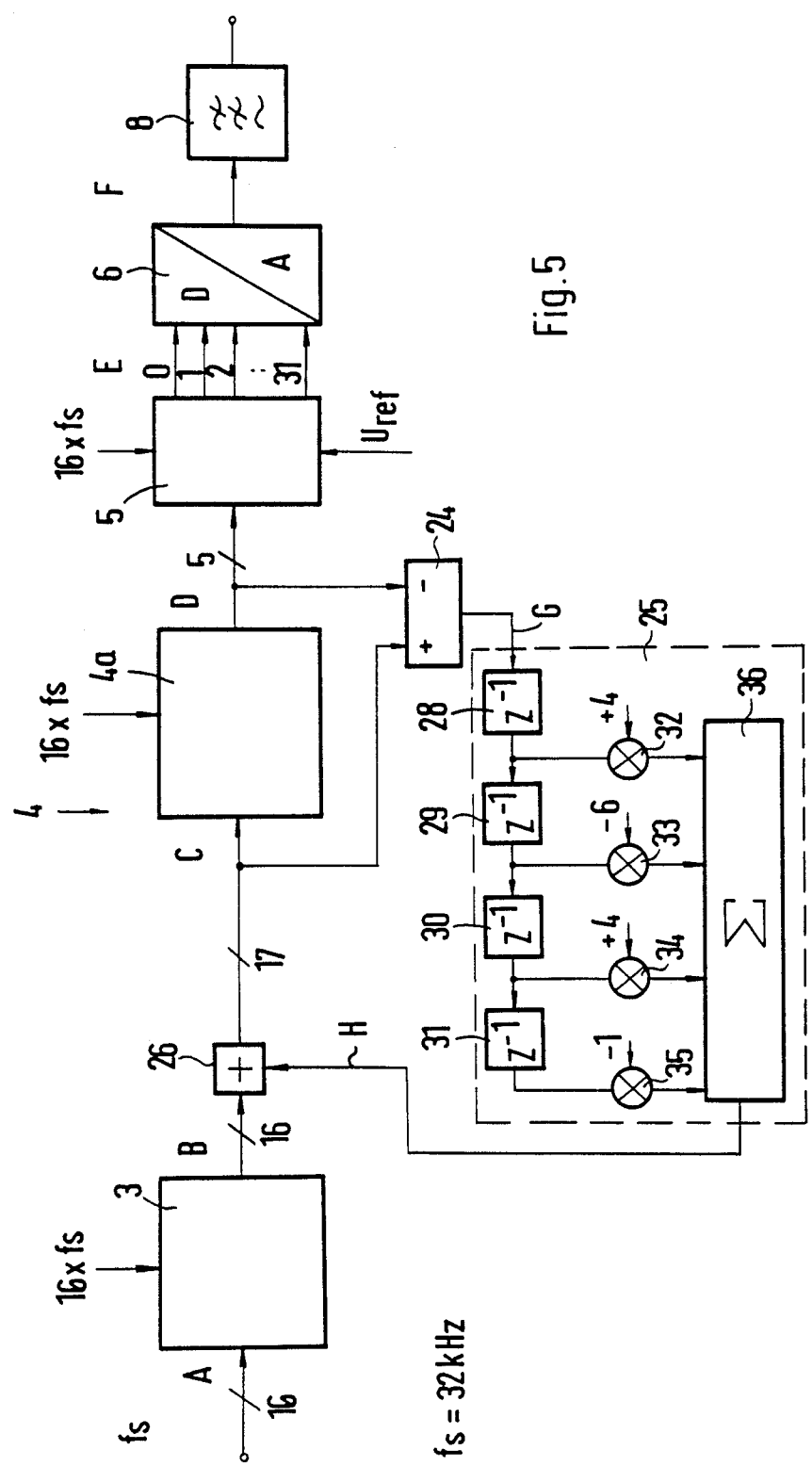
FIG. 5 shows a detailed embodiment of a circuit arrangement according to the invention in which interpolative digital-to-analog conversion takes place.
Figure 10:
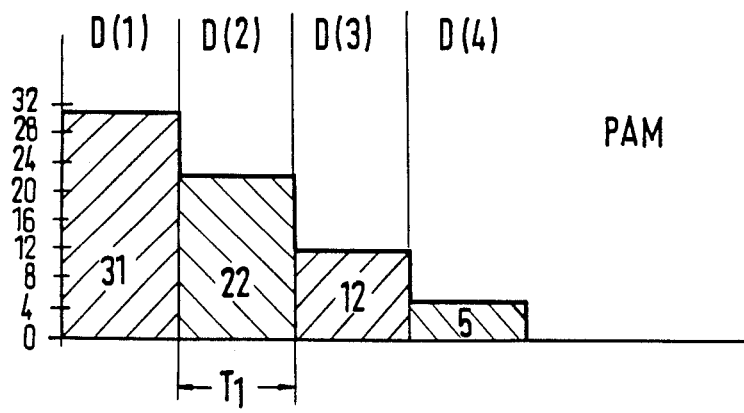
Figure 11:
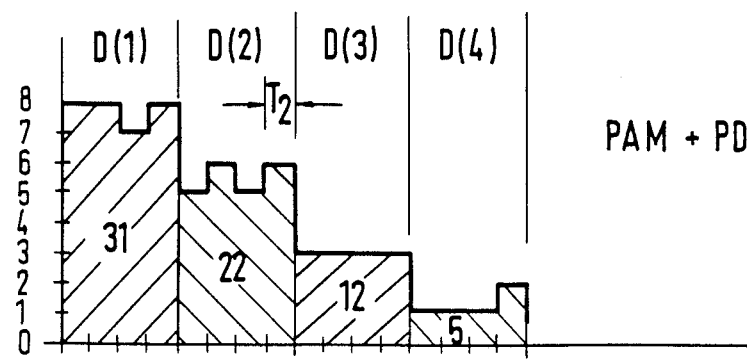
Figure 12:
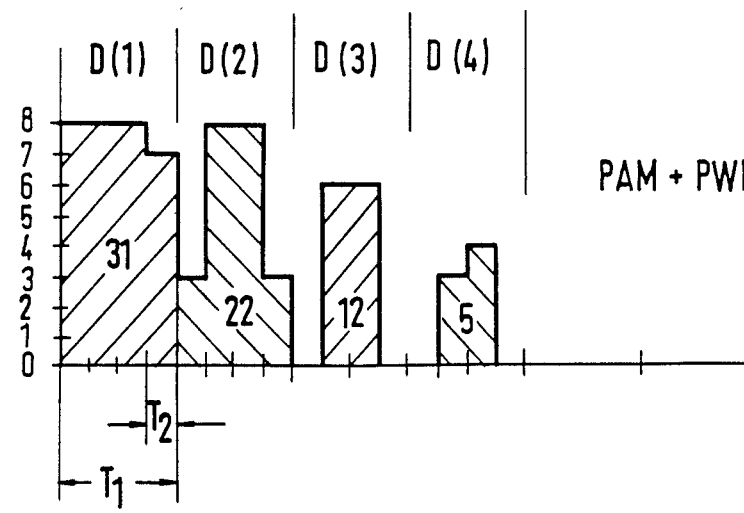
Figure 13:
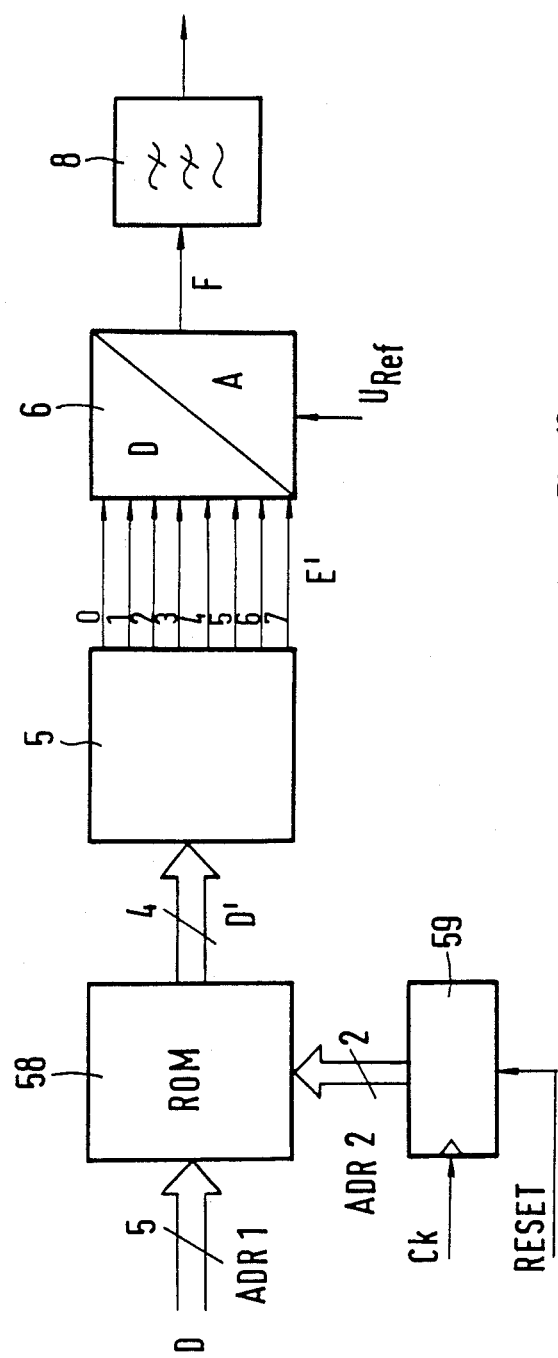

FIGS. 10, 11, and 12 show different output waveforms of the digital-to-analog converter in a circuit arrangement according to the invention with a reduction circuit as shown in FIG. 13, and FIG. 13 shows a reduction circuit for reducing the number of quantization levels in the circuit arrangement of FIG. 5.

Figure 1:
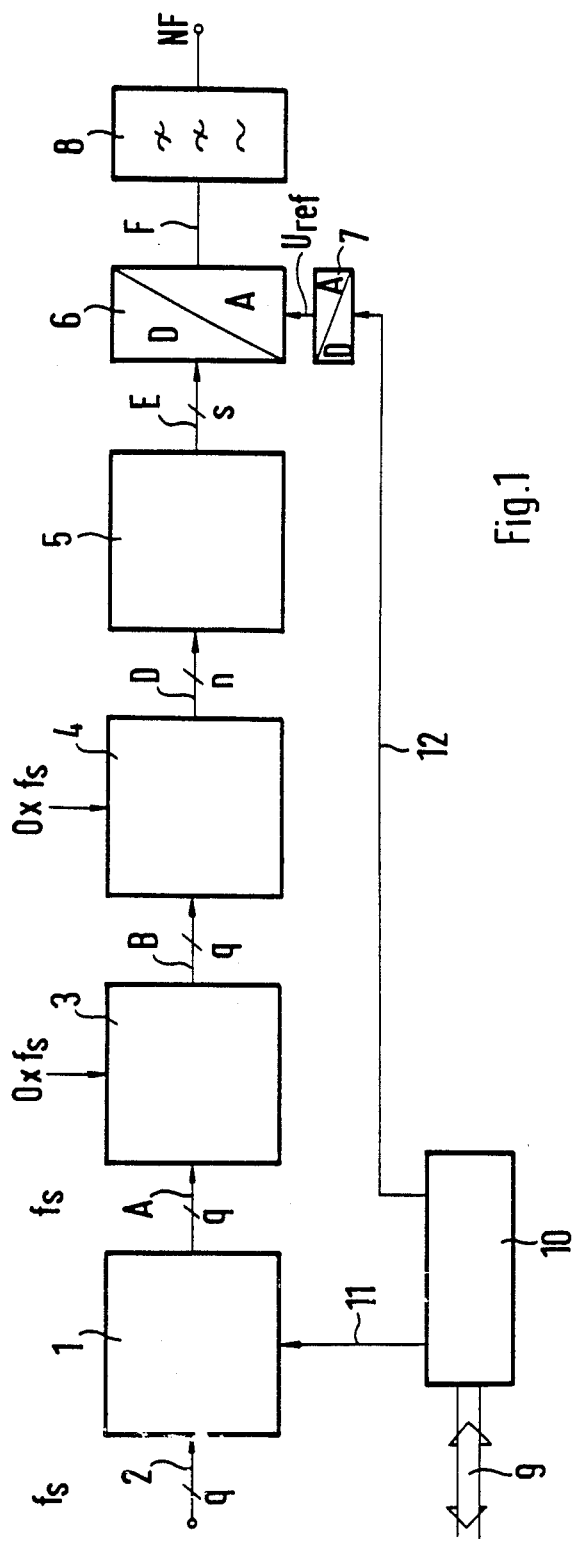
FIG. 1 is a block diagram of a circuit arrangement according to the invention in which interpolative digital-to-analog conversion takes place.

In a tone-control circuit 1 formed by a programmable arithmetic logic unit with internal read-only and random-access memories, the sound-signal values arriving over an input line are adjusted in volume, balance, treble frequency, and bass frequency (FIG. 1). The input line has 2 q parallel conductors, where q is the number of bits of the incoming digital signal values or "words". In the embodiment, q=16, i.e., the sound signals are quantized into $2^{16}$ levels. Their sampling rate $f_s$ at the input end is 32 kHz. The internal word length in the tone-control circuit 1 is 24 bits. Over a line A, the signal values (q=16 bits) are transferred to a interpolation filter 3 with an oversampling factor U. In the embodiment, o=16. Over a line B (the letters A, B, ... will hereinafter be used to designate both the lines and the signal values transferred over these lines), the output of the interpolation filter 3 is applied to a reduction circuit 4, in which the word length is reduced from sixteen to five bits by quantization error feedback. Details of this reduction circuit will be explained with the aid of FIG. 5.

Over a line D, signal values with a word length n (e.g., n=5) are transferred to a control circuit 5, where they are converted into s parallel bits (in the example, s=32), which are transferred to a digital-to-analog converter 6. The output of this converter is applied over a line F to a low-pass filter 8 and leaves the latter as an audio-frequency sound signal NF. Only one of the two stereophonic channels is shown here.

The control signals arriving over a control bus 9 pass through an interface circuit 10 and are applied over a first control line 11 to the tone-control circuit 1, where the volume of the sound signal and the other sound parameters mentioned above are controlled digitally. Over a second control line 12, a digital control signal is applied to an additional digital-to-analog converter 7, which delivers a controlled reference voltage $U_{ref}$ to the multiplying digital-to-analog converter 6 for analog volume readjustment. Compared with purely digital volume adjustment, where the quantization becomes coarser with decreasing volume, analog readjustment results in a signal-to-noise improvement at reduced volume.

The normal digital-to-analog converter 7 can be replaced by a pulse-width modulator or a pulse-density modulator. The output of the digital-to-analog converter 7 must then be followed by a filter for smoothing the reference voltage $U_{ref}$.

Figure 2:
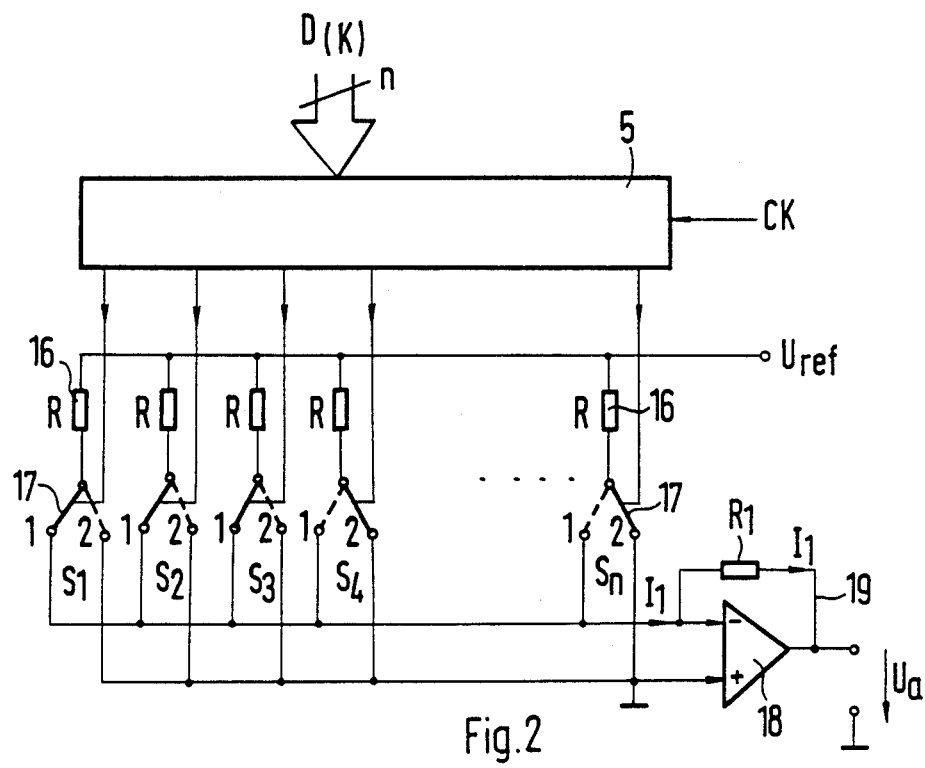
FIG. 2 shows a digital-to-analog converter usable in the circuit arrangement of FIG. 1.

The signal-value sequence D(K) fed to the control circuit 5 - K is the sequence index - is decoded in the control circuit (FIG. 2). The switching signals so obtained control several parallel switching stages which each consist of a switch 17 in series with a resistor 16. In a position 1 of the switch 17, the latter connects the resistor 16, to which a reference voltage $U_{ref}$ is applied, to the inverting input of an operational amplifier 1; in a position 2, the switch 17 connects the resistor 16 to the noninverting input, which is grounded. The output of the operational amplifier 18 is connected to the inverting input by a feedback path 19 containing a resistor R1.

The resistors 17 are not weighted in accordance with the ratio of the binary weights $(1: 2: 4: \ldots : 2^N)$ as is the case in conventional digital-to-analog converters, but they all have the same value. To represent $2^N$ amplitude values, $2^N - 1$ switches are therefore necessary. The total output current I1 thus depends on the number of switching stages that are in position 1.

The above-mentioned analog volume readjustment is controlled by varying the reference voltage $U_{ref}$ with the output from the digital-to-analog converter 7 (FIG. 1). As mentioned in connection with FIG. 1, the number of switching stages can be reduced to values from 8 to 31 by a preceding word-length-reducing device with oversampling and quantization error feedback. However, such devices do not reduce the accuracy requirement placed on the D/A conversion. To implement a 16-bit system with a signal-to-noise ratio of 98 dB, for example, the digital-to-analog converter must have only few quantization levels after the word-length reduction, but the accuracy (linearity) of the quantization levels must be approximately equal to that of a 16-bit digital-to-analog converter without word-length reduction. Even with the circuit arrangement disclosed in the above-mentioned prior patent application, in which a high signal-to-noise ratio is achieved with a digital-to-analog converter of relatively low linearity, relatively high accuracy is necessary.

With the control scheme described with the aid of the following figures, a signal-to-noise ratio of about 95 dB is attainable even if the values R of the resistors 16 show a high relative deviation of up to 0.5 percent.

Figure 3:
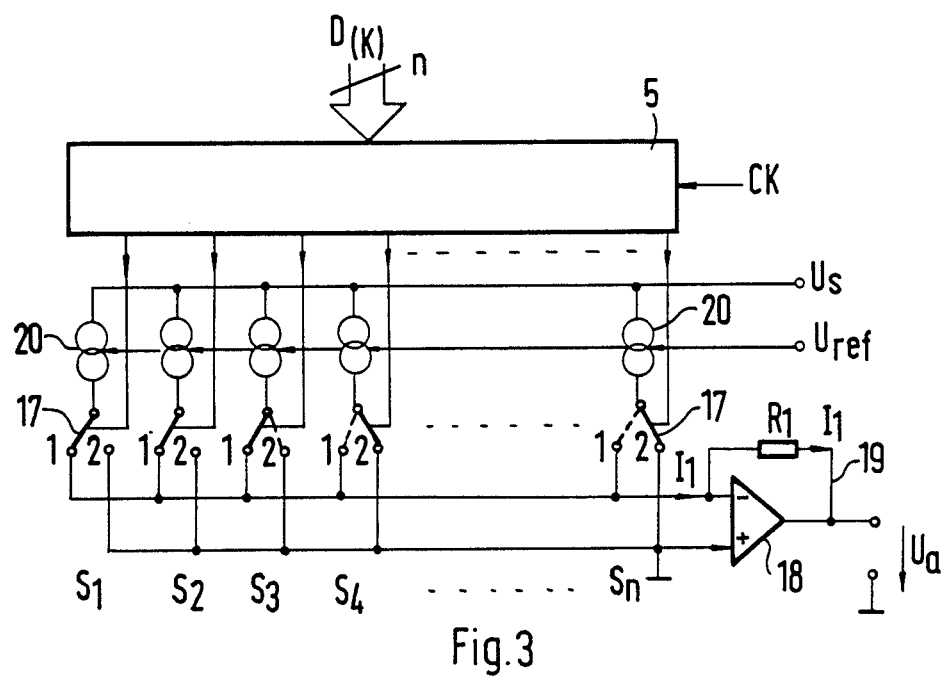
FIG. 3 shows another digital-to-analog converter usable in the circuit arrangement of FIG. 1.

The same applies analogously to the decoding and D/A-converter circuit of FIG. 3. This circuit differs from that of FIG. 2 in that the resistors of the parallel switching stages were replaced by individual current sources 20. For the latter, too, a maximum relative deviation of about 0.5% is to be permitted.

A supply voltage $U_s$ for the current sources 20 is constant. For analog volume readjustment, the individual current sources 20 are subjected to a control voltage $U_{ref}$ which is determined by the output signal of the digital-to-analog converter 7.

Figure 4:
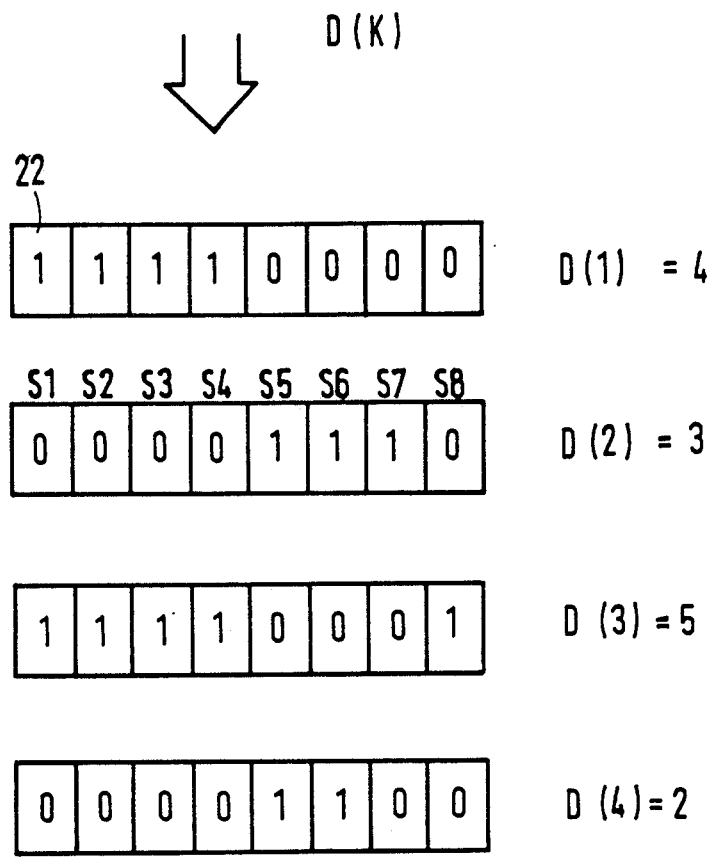
FIG. 4 is a schematic representation of a switching sequence for a digital-to-analog converter of the circuit arrangement of FIG. 1 having eight switching stages.

The aim to permit high relative deviations of the individual functions can be achieved by arranging for a cyclic selection of the switches for the delivery of the successive amplitude values of the sound signal. FIG. 4 shows schematically an example of a digital-to-analog converter with eight switches 17, whose positions are illustrated as blocks 22. The signal-amplitude values D(1)=4, D(2)=3, D(3)=5, and D(4)=2, which are received from the reduction circuit 4, are to be delivered by the digital-to-analog converter one after the other.

The first amplitude value "4" is represented by connecting the first four resistors (or current sources) to the inverting input of the operational amplifier 18 by closing the associated switches 17 - S1 to S4 -, i.e., beginning with the switch S1, the first fourth switches are placed in position 1. The following amplitude value "3" is represented by closing the switches S5 to S7 and opening the switches S1 to S4. For the next amplitude value "5", the last switch S8 and then the first four switches S1 to S4 are closed. Then, the switches S5 and S6 are closed to deliver the amplitude value "2", etc. As a result of the cyclic switch change, unavoidable amplitude variations caused by deviations of the individual components average out, i.e., the integration of the deviations tend to zero.

The amplitude variations cause a noise spectrum which goes far beyond the audible range in a digital-to-analog converter system with oversampling. Referred to the audible range, the signal-to-noise ratio caused by component tolerances increases with increasing oversampling factor o.

Over the conventional principle of binary weighted resistors or input currents, the construction of the digital-to-analog converter from identical resistors or current sources gives an improvement in signal-to-noise ratio by $2^n$ (n=word length) for the same percentage component tolerance. It is thus apparent that a very high signal-to-noise ratio is achieved with the D/A converter circuit according to the invention, i.e., with cyclic switch operation in connection with a word-length reduction device.

The circuit arrangement shown in FIG. 5, in which interpolative D/A conversion takes place, includes a word-length reduction circuit 4 with oversampling and quantization error feedback. Parts which were already described in connection with FIG. 1 will not be explained again in detail.

The output of the interpolation filter 3 is connected via an adding stage 26 to the input of a quantizer 4a. The quantizer 4a reduces the word length of the signal values C coming from the adding stage 26, so that its output provides 5-bit parallel words.

A subtracter 24 forms a quantization error sequence G by subtracting the output signals D of the quantizer 4a from the input signals C, taking account of their weights. In the embodiment, the quantization error values correspond to the separated least significant bits of the input signal C. An error filter 25 derives feedback values H from the quantization error values G. These feedback values H are added in the adding stage 26 to the signal values B from the output of the interpolation filter 3 to obtain the input signal values C for the quantizer 4a. If the error filter 25 has a suitable time response, the quantization error feedback, which is known per se, causes the audible portion of the quantization noise spectrum at the output D of the reduction circuit 4 to be shifted toward higher frequencies, i.e., toward frequencies outside the audible range.

The error filter 25 is a fourth-order filter. The quantization error values G pass through four successive delay elements 28, 29, 30, and 31. The outputs from these delay elements are fed to associated multipliers 32, 33, 34, and 35, respectively, which multiply them by the factors +4, −6, +4, and −1. The products are fed to an adder 36. The output signals of this adder 36 represent the feedback values H, which are fed to the adding stage 26.

With such a fourth-order error filter, the word length can be reduced from 16 bits to theoretically 4 bits. However, the error filter causes overshoot, which makes it appear advisable to increase the input word for the reduction circuit 4 from 16 to 17 bits and the output word from 4 to 5 bits. The output of the decoder 5 thus has 32 terminals 0 to 31, which control the switching stages of the D/A converter 7 in the manner described.

Figure 6:
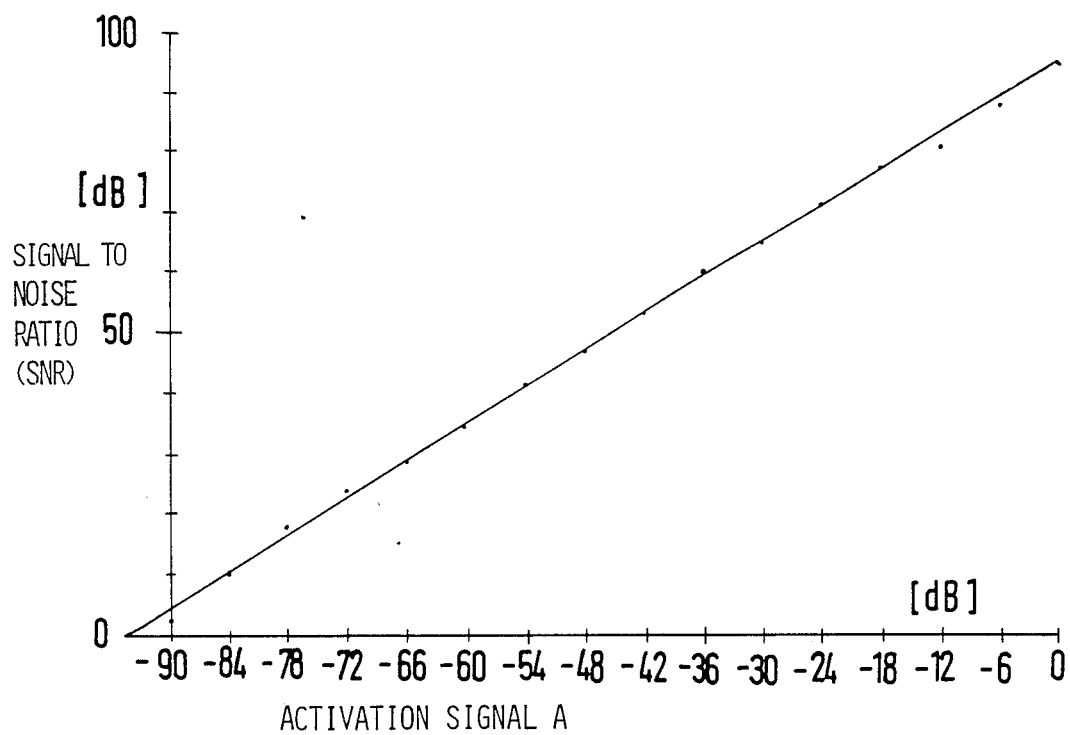
FIG. 6 is a plot of signal-to-noise ratio versus signal level.

In FIG. 6, the signal-to-noise ratio of the circuit arrangement according to the invention is plotted against the signal level for the case where a sinusoidal value sequence is present on the line A. The maximum signal-to-noise ratio at maximum signal level is about 95 dB. This value applies for resistance tolerances of about 0.5%. The theoretical maximum value of a 16-bit system is 98 dB.

The output frequency of the pulse-amplitude-modulated signal is 512 kHz and, thus, clearly below the pulse output frequency of the conventional pulse-density modulation process - 1-bit converter principle -, which is about 8 MHz. Accordingly, less power is consumed with the method according to the invention. Because of the lower output frequency, the problems caused by edge jitter and energy crosstalk in the case of pulses following each other directly in time are less severe than with the PDM method, too. Compared with commercially available D/A converters with binary weighted resistor or current-source networks, the glitch energy is considerably lower, because all current sources never turn on or off simultaneously. The time errors occurring with pulse-width modulation, which may produce an additional noise spectrum, are eliminated. With multiplicative D/A conversion, analog volume and balance readjustment is possible by varying the reference voltage, which permits a reduction in signal-to-noise ratio at reduced volume, as mentioned above.

Because of the high relative tolerances of about 0.5% which are permissible for the individual resistors or current sources, the circuit arrangement according to the invention is suitable for CMOS integration.

Figure 7:
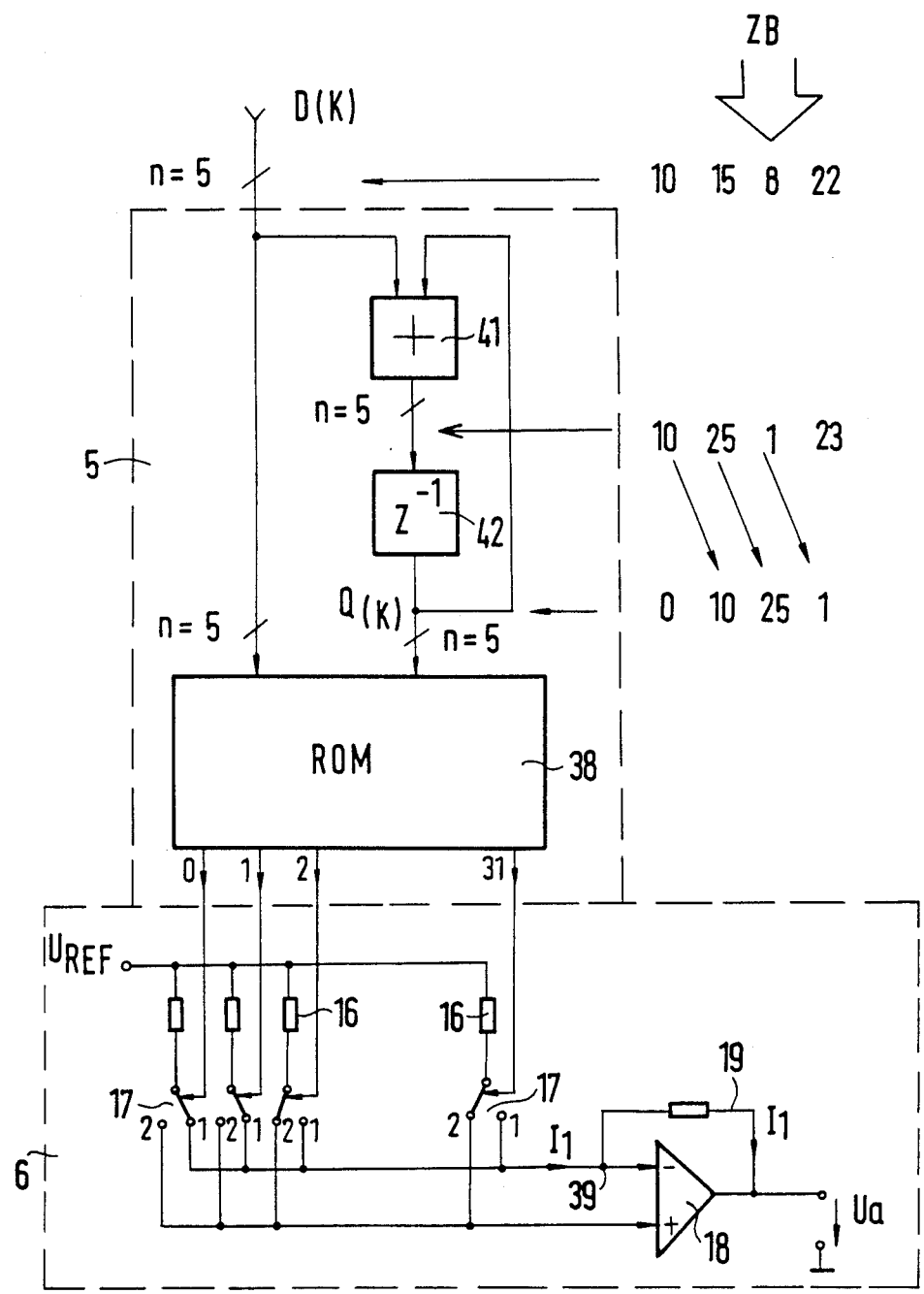
FIG. 7 shows a first embodiment of a control circuit for the circuit arrangement of FIG. 5.

The control circuit 5 of FIG. 7 contains a read-only memory (ROM) 38. A number of switches 17 determined by the applied signal value D(K) is placed in position 1 from a start mark. The output currents of the switches 17 are added in a summing point 39 to give the total current I1. The start mark is formed by accumulation of the input value D(K) in an accumulator consisting of a 5-bit adder 41 and and delay element 42.

The input values D(K) and the accumulator output values Q(K) form addresses for the read-only memory 38. This memory contains allocation tables for the decoding of the input values and for the cyclic switch control.

On the right-hand side of FIG. 7, the operation of the accumulator 41, 42 is illustrated by a numerical example ZB.

The number of bits that can be contained in the read-only memory is $p=2^{3n}$. For $n=5$, $p=2^{15}$. This is a relatively large capacity and thus requires a large area on a semiconductor chip.

Figure 8:
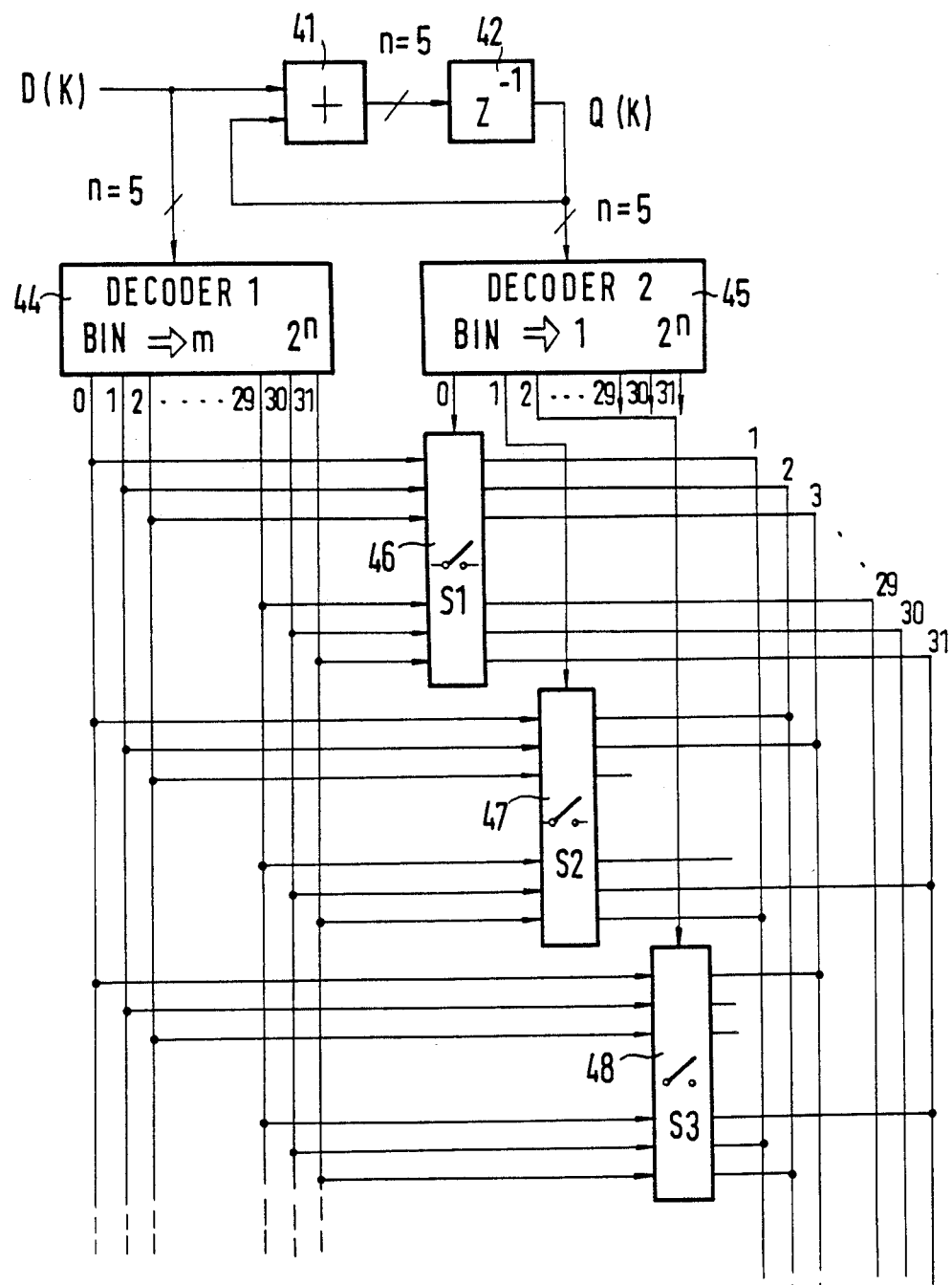
FIG. 8 shows a second embodiment of a control circuit for the circuit arrangement of FIG. 5.

The embodiment of a control circuit for a D/A converter shown in FIG. 8 includes an accumulator consisting of an adder 41 and a delay element 42, too. Instead of the read-only memory, two decoders 44 and 45 are provided. The decoder 44 converts the binary values D(K) into an m-out-of-$2^n$ code. If the input value D(1)=4, for example, the outputs 0 to 3 of the decoder 44 are at logic 1 and the others are logic 0. For D(2)=3, its outputs 0 to 2 are at logic 1. For D(3)=0, all outputs are at logic 0. The decoder 45 converts the accumulated parallel input words of the start mark into a 1-out-of-$2^n$ code.

All outputs of the decoder 44 are connected by a bus to $2^n$ switch assemblies 46, 47, 48, . . . , which each contain $2^n$ switches, symbolized by one switch Sn. The switches of each switch assembly 46, 47, 48, . . . are controlled by the decoder 45 via a common control line.

The outputs of the switch assemblies 46, 47, 48, . . . are connected with a cyclic shift to a control bus which drives the current switches 17 of the D/A converter 6 (not shown in FIG. 8). Thus, only one of the switch assemblies is connected to the output bus with a cyclic shift corresponding to the decoded start mark. This results in the cyclic step-by-step switching of the current sources of the D/A converter in accordance with the respective digital input value as was explained with the aid of FIG. 4.

In the example of FIG. 8, the number of switches is $2^{2n}$ and, thus, $2^n$ times smaller than the number of bits that can be contained in the read-only memory 38. Since only one transfer gate with two MOS transistors is necessary for each switching function, the complexity of the circuit is considerably reduced.

Figure 9:
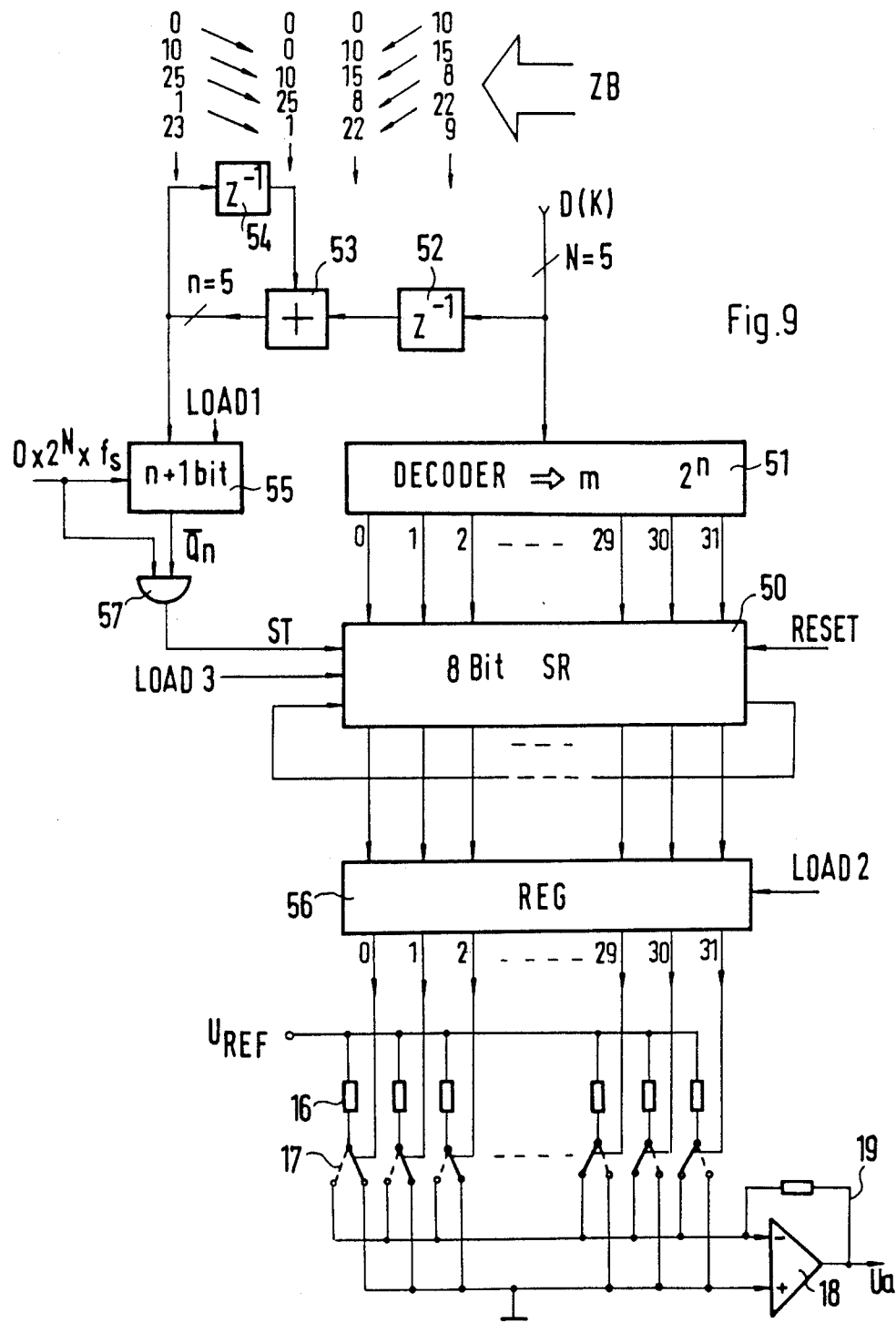
FIG. 9 shows a third embodiment of a control circuit for the circuit arrangement of FIG. 5.

The control circuit shown in FIG. 9 includes a shift register 50 used as a ring counter which is set in parallel by an m-out-of-$2^n$ decoder. The input data is also fed through a delay element 52 to an accumulator consisting of an adder 53 and an additional delay element 54. The $n=5$ bit wide output value of the accumulator, which is delayed by one clock cycle, is applied to an $(n+1)$-bit down counter 55 with parallel data inputs, which is enabled by a signal LOAD1. By ANDing the most significant data output $\overline{Q}_n$ with the input clock of the counter in an AND gate 57, serial pulses are obtained whose repetition rate is $2^n$ times that of the input data D. When the count falls below zero, the gate 55 is inhibited. The number of pulses thus corresponds to the parallel value at the output of the accumulator, i.e., parallel-to-serial conversion takes place. The serial output signal of the AND gate 57 forms the shift signal for the ring counter 50, so that the data D(K) loaded into the ring counter with the control signal LOAD3 will be shifted by the accumulated count value to the right. After the end of the shifting process, the contents of the shift register 50 are placed in a register 56, whose outputs control the switching stages 16, 17 of the digital-to-analog converter. Before the ring counter is again set in parallel with the new input word D(K), all its cells are reset to zero with a RESET pulse.

This embodiment requires an especially small amount of storage space, but the shift pulse rate must be $2^n$ times higher than in the two previously described embodiments.

The effect of the delay and accumulation of the input values D(K) is illustrated by a numerical example ZB given in FIG. 9 at the top.

To represent a 5-bit word, $2^5-1=31$ switched resistors are sufficient, because no current source is needed for the value 0. However, to permit the use of basic accumulator circuits, FIGS. 7, 8, and 9 contain 32 switching stages, of which a maximum of 31 are activated simultaneously.

Using a specific accumulator circuit which changes to zero instead of 31, i.e., is reset one count stage earlier, and which, if a number x is added to 31, provides the accumulated result x, a corresponding decoder circuit with only 31 outputs can be formed.

With the aid of FIGS. 10 to 13, a method will now be explained which reduces the number of quantization levels of the digital-to-analog converter, so that the circuit takes up less chip area, particularly if switched resistors are used. With polysilicon resistors, for example, the area required increases with increasing accuracy requirement and increasing resistance value.

Theoretically, a reduction of the number of quantization levels required can be achieved by further increasing the oversampling factor. This, however, would result in a considerable increase in the circuit complexity of the interpolation filter. Therefore, the approach described in the following is more appropriate.

The output waveform of the D/A converter shown in FIG. 10 represents the pure pulse-amplitude modulation used in the embodiments explained above. As examples, the amplitude values D(1)=31, D(2)=22, D(3)=12, and D(4)=5 are shown.

In FIG. 11, each output value is represented by four partial pulses of different height. Consequently, the pulse repetition rate quadruples. For the partial pulses, only the quantization levels 0 to 8 and, thus, only eight switching stages are needed. The area quantization is 4·8=32, however. For a 5-bit input word, only 31 of the 32 maximally possible area elements are utilized. The 32nd quantization level corresponds to the digital value 0, which activates no area element. The positions of the partial pulses which are smaller or larger by one quantization level should be so distributed that the noise spectrum caused by their time errors has a minimum in the audible range. This output waveform corresponds to a combination of pulse-amplitude and pulse-density modulation.

FIG. 12 shows another output format of the pulses of a pulse packet which corresponds to a combination of pulse-amplitude and pulse-width modulation. Here the influence of the sampling rate 1/T1 is greater than in FIGS. 10 and 11. Therefore, postfiltering with a higher-order filter is necessary. The time errors are larger, too, thus forming a stronger noise spectrum in the audible range than in the case of the output waveform of FIG. 11.

FIG. 13 shows a reduction circuit for reducing the number of quantization levels and implementing the pulse outputs of FIGS. 11 and 12. It is connected ahead of the control circuit 5 (see also FIGS. 1 and 5). The input data forms an address ADR1 of a read-only memory 58. The four pulse-amplitude values stored for a data value D(K) are selected by a cycle counter 59 via a 2-bit address ADR2. The clock rate Ck of the counter 59 is equal to four times the data rate of D(K).

To represent the nine quantization levels 0 to 8, a four-bit output word is necessary. A reset pulse RESET serves to mark the correct initial position of the counter 59 upon a change in the input data D(K).

I claim:

1. Circuit arrangement for converting digital sound-signal values into an analog sound signal which has the following features:
    an interpolation filter in which the incoming signal values are converted into a sequence of interpolated signal values of an increased repetition rate,
    a reduction circuit which reduces the word length of said interpolated signal values and includes a quantizer, an error filter, and an adding stage,
    a digital-to-analog converter including a plurality of switching stages whose output currents are added at the output end of said digital-to-analog converter,
    a control circuit which, in response to digital signal values at the output of said quantizer, controls said switching stages in such a way that the sum of the output currents is equal to said applied signal values, and selects respective ones of said switching stages by cyclic step-by-step switching, and
    a low-pass filter following said digital-to-analog converter which delivers the analog signal.

2. A circuit arrangement as claimed in claim 1, in which the digital-to-analog converter contains at least two of said switching stages, so that it delivers pulses with at least three different amplitude values.

3. A circuit arrangement as claimed in claim 1, in which the output currents of said switching stages are added at a summing point.

4. A circuit arrangement as claimed in claim 3, in which each of said switching stages includes a resistor and a switch which, if activated, connects said resistor to the inverting input of an operational amplifier with feedback, each said resistor being connected in parallel and having the same value of resistance.

5. As circuit arrangement as claimed in claim 3, in which each of said switching stages includes a current source and a switch which, when activated, connects said current source to the inverting input of an operational amplifier with feedback, each of said current sources being substantially identical to one other.

6. A circuit arrangement as claimed in claim 5, characterized in that all current sources are controllable with a reference voltage.

7. A circuit arrangement as claimed in claim 1, in which the control circuit comprises:
    an accumulator consisting of an adder having the word length of the incoming digital values and followed by a delay element, and
    a read-only memory whose addresses are formed by the incoming signal values and the output values of the accumulator, and whose output data control the switching stages by switching them cyclically step by step.

8. A circuit arrangement as claimed in claim 1, in which the control circuit comprises:
    a first decoder which converts the incoming digital signal values (n-bit words) into an m-out-of-$2^n$ code,
    a second decoder which converts the incoming digital signal values, summed in an accumulator, into a 1-out-of-$2^n$ code, and
    $2^n$ switch assemblies which are controlled by the outputs of the second decoder and, in the ON state, connect the outputs of the first decoder to other switching stages.

9. A circuit arrangement as claimed in claim 1, in which the control circuit comprises:
- a decoder which converts the incoming signal values into an m-out-of-$2^n$ code,
- a shift register used as a ring counter which is set by the outputs of the decoder,
- an accumulator which sums the incoming signal values and delays them by one clock cycle,
- an $(n+1)$-bit counter and an AND gate which convert the parallel output values from the accumulator into serial shift pulses for the shift register,
- a register into which the information shifted out of the shift register is entered and whose outputs control the switching stages of the digital-to-analog converter, and
- a reset input via which all cells of the shift register are reset to zero before a new digital signal value is transferred into the shift register in parallel.

10. A circuit arrangement as claimed in claim 1, comprising an additional reduction circuit in which each incoming signal value is converted into a number of r digital partial values whose sum is equal to said signal value and which are fed to said control circuit.

11. A circuit arrangement as claimed in claim 10, in which said partial values and the positions of said partial values are so chosen that the noise spectrum caused by their time error has a minimum in the audible range.

12. A circuit arrangement as claimed in claim 10, comprising a read-only memory to which the incoming signal values are fed as a first address,
- to which the count of a cycle counter is fed as a second address, and whose data outputs are connected to the inputs of the control circuit.

* * * * *

UNITED STATES PATENT AND TRADEMARK OFFICE
CERTIFICATE OF CORRECTION

PATENT NO. : 4,868,572

DATED : September 19, 1989

INVENTOR(S) : Hans Reiber

It is certified that error appears in the above-identified patent and that said Letters Patent is hereby corrected as shown below:

In the heading of the patent, under [30] Foreign Application Priority Data, the first German priority application number should be --3706508.--.

Signed and Sealed this

Ninth Day of October, 1990

Attest:

HARRY F. MANBECK, JR.

Attesting Officer

Commissioner of Patents and Trademarks